United States Patent
Chien et al.

(10) Patent No.: US 6,303,510 B1
(45) Date of Patent: Oct. 16, 2001

(54) PLASMA ETCH METHOD WITH ATTENUATED PATTERNED LAYER CHARGING

(75) Inventors: Wen-Cheng Chien, Kaoshiung Country; Hui-Chen Chu, Kao-Hsuing County, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/336,810

(22) Filed: Jun. 21, 1999

(51) Int. Cl.$^7$ ................ H01L 21/302; H01L 21/461
(52) U.S. Cl. ................ 438/710; 438/711; 438/714; 438/734
(58) Field of Search ................ 438/734, 749, 438/751, 706, 707, 710, 711, 714, 715, 726, 728, 732; 216/63, 70

(56) References Cited

U.S. PATENT DOCUMENTS

| | | | |
|---|---|---|---|
| 5,435,886 | * 7/1995 | Fujiwara et al. | 156/643.1 |
| 5,556,501 | 9/1996 | Collins et al. | 156/345 |
| 5,587,045 | 12/1996 | Keller et al. | 156/627.1 |
| 5,618,382 | 4/1997 | Mintz et al. | 216/64 |
| 5,656,123 | 8/1997 | Salimian et al. | 156/345 |
| 5,760,445 | 6/1998 | Diaz | 257/356 |
| 5,773,199 | * 6/1998 | Linliu et al. | 430/316 |
| 5,981,398 | * 11/1999 | Tsai et al. | 438/710 |
| 6,008,132 | * 12/1999 | Tabara | 438/714 |

* cited by examiner

*Primary Examiner*—Matthew Smith
*Assistant Examiner*—Lex H. Malsawma
(74) *Attorney, Agent, or Firm*—George O. Saile; Stephen B. Ackerman; Stephen G. Stanton

(57) ABSTRACT

A plasma etch method for forming a patterned layer first employs a substrate having formed therover a blanket microelectronic layer. There is also formed over the blanket microelectronic layer a patterned mask layer. There is then etched, while employing a first plasma etch method which employs the patterned mask layer as an etch mask layer, the blanket microelectronic layer to form a partially etched blanket microelectronic layer. There is then etched, while employing a second plasma etch method which employs the patterned mask layer as an etch mask layer, the partially etched blanket microelectronic layer to form a patterned microelectronic layer. Within the present invention, the first plasma etch method employs a higher bias voltage than the second plasma etch method.

13 Claims, 2 Drawing Sheets

PLASMA ETCH METHOD WITH ATTENUATED PATTERNED LAYER CHARGING

BACKGROUND OF THE INVENTION

1. Field of the Invention

The present invention relates generally to methods for forming patterned layers within microelectronic fabrications. More particularly, the present invention relates to plasma etch methods for forming patterned layers within microelectronics fabrications.

2. Description of the Related Art

Microelectronic fabrications are formed from microelectronic substrates over which are formed patterned microelectronics conductor layers which are separated by microelectronic dielectric layers. As microelectronic fabrication integration levels have increased, it has become common within the art of microelectronic fabrication to form patterned microelectronic conductor layers with increasingly narrower linewidth dimensions. While a need for forming patterned microelectronic conductor layers within increasingly narrower linewidth dimensions within microelectronic fabrications will certainly continue, patterned microelectronic conductor layers are typically not formed with increasingly narrower linewidth dimensions within microelectronic fabrications entirely without problems. In that regard, it is known in the art of microelectronic fabrication that when forming a patterned microelectronic conductor layer within a microelectronic fabrication while employing a plasma etch method, there is often observed an electrical charging of the patterned microelectronic conductor layer in a fashion which upon discharge may provide compromised operation of a microelectronics fabrication within which is formed the patterned microelectronic conductor layer formed employing the plasma etch method.

It is thus towards the goal of forming within microelectronic fabrications patterned microelectronic conductor layers while employing plasma etch methods, while simultaneously attenuating plasma induced electrical charging of those patterned microelectronic conductor layers formed employing those plasma etch methods, that the present invention is more specifically directed. In a more general sense, it is also towards the goal of forming within microelectronic fabrications patterned microelectronic layers, which need not necessarily be patterned microelectronic conductor layers, while employing plasma etch methods and while simultaneously attenuating plasma induced electrical charging of those patterned microelectronic layers, that the present invention is generally directed.

Various plasma etch methods and plasma etch apparatus have been disclosed in the art of microelectronic fabrication for forming patterned microelectronic layers within microelectronic fabrications.

For example, Collins et al., in U.S. Pat. No. 5,556,501, discloses a radio frequency plasma processing apparatus which may be employed for forming within microelectronic fabrications microelectronic devices and patterned microelectronic conductor layers with attenuated plasma induced damage and attenuated microloading. The plasma processing apparatus employs an inductively coupled radio frequency plasma antenna to provide a high density low energy plasma for etching microelectronic materials within the plasma processing apparatus, where a radio frequency bias power may be applied to a substrate processed within the plasma processing apparatus independent of an inductively coupled radio frequency source power employed for forming the high density low energy plasma.

In addition, Keller et al., in U.S. Pat. No. 5,587,045, discloses a plasma processing apparatus which may be employed within a plasma processing method in order to reduce a number of particles collected upon a substrate when processing the substrate while employing the plasma processing method in conjunction with the plasma processing apparatus. The plasma processing apparatus realizes the foregoing result by imposing a slight negative potential on the substrate at all times when not directly plasma processing the substrate while employing the plasma processing method in conjunction with the plasma processing apparatus.

Further, Mintz, et al., in U.S. Pat. No. 5,618,382, discloses a plasma processing apparatus which provides a reduced self-bias within a powered electrode within the plasma processing apparatus such that softer plasma processes which do not damage thin layers may be employed within the plasma processing apparatus. In order to achieve the foregoing results, the plasma apparatus operates at a frequency significantly above 13.56 MHZ.

Still further, Salimian et al., in U.S. Pat. No. 5,656,123, also discloses a plasma processing apparatus which may be employed to provide a plasma having a high plasma density and a low sheath bias voltage for plasma processing a substrate employed within a microelectronic fabrication. The plasma processing apparatus employs a dual frequency triode, where a very high frequency within the dual frequency triode is employed to form the high density plasma with the low sheath bias voltage, and a low frequency within the dual frequency triode is employed to supply an independent substrate bias.

Finally, Diaz, in U.S. Pat. No. 5,760,445, discloses a microelectronic device which may be employed to protect against a plasma induced charge build-up on a thin gate oxide within a field effect transistor (FET) when plasma etching a microelectronic structure which electrically communicates with the thin gate oxide within the field effect transistor (FET). The microelectronic device which realizes the foregoing properties is characterized as a P-metal oxide semiconductor field effect transistor (P-MOSFET).

Desirable in the art of microelectronic fabrication are additional plasma etch methods which may be employed for forming patterned microelectronic layers with attenuated plasma induced damage. It is towards the foregoing object that the present invention is directed.

SUMMARY OF THE INVENTION

A first object of the present invention is to provide a plasma etch method for forming a patterned microelectronic layer within a microelectronic fabrication.

A second object of the present invention is to provide a plasma etch method in accord with the first object of the present invention, where there is attenuated plasma induced damage when forming the patterned microelectronic layer while employing the plasma etch method.

A third object of the present invention is to provide a plasma etch method in accord with the first object of the present invention and the second object of the present invention, which method is readily commercially implemented.

In accord with the objects of the present invention, there is provided by the present invention a plasma etch method for forming a patterned microelectronic layer within a microelectronic fabrication. To practice the method of the present invention, there is first provided a substrate. There is then formed over the substrate a blanket microelectronic layer. There is then formed over the blanket microelectronic layer a patterned mask layer. There is then etched, while employing a single first plasma etch method which employs the patterned mask layer as an etch mask layer, the blanket microelectronic layer to form a partially etched blanket microelectronic layer. There is then etched, while employing a single second plasma etch method which employs the patterned mask layer as an etch mask layer, the partially etched blanket microelectronic layer to form a patterned microelectronic layer, where the first plasma etch method has a bias voltage greater than the second plasma etch method.

There is provided by the present invention a plasma etch method for forming a patterned microelectronic layer within a microelectronic fabrication, where there is attenuated plasma induced damage when forming the patterned microelectronic layer. The present invention realizes the foregoing object by employing when forming the patterned microelectronic layer from a corresponding blanket microelectronic layer: (1) a single first plasma etch method which forms from the blanket microelectronic layer a partially etched blanket microelectronic layer; and (2) a single second plasma etch method which forms from the partially etched blanket microelectronic layer a patterned microelectronic layer, where the first plasma etch method has a higher bias voltage than the second plasma etch method.

The present invention is readily commercially implemented. The present invention may be effected employing methods and materials as are conventional in the art of microelectronic fabrication. Since it is a process control which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a plasma etch method for forming a patterned microelectric layer within a microelectronic fabrication, where there is attenuated plasma induced damage when forming the patterned microelectronic layer within the microelectronic fabrication while employing the plasma etch method. The present invention realizes the foregoing object by employing when forming the patterned microelectronic layer within the microelectronic fabrication: (1) a single first plasma etch method which forms from a blanket microelectronic layer a partially etched blanket microelectronic layer; and (2) a subsequent single second plasma etch method which forms from the partially etched blanket microelectronic layer the patterned microelectronic layer, where the first plasma etch method has a higher bias voltage than the second plasma etch method.

The present invention may be employed for forming patterned microelectronic layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although the preferred embodiment of the present invention illustrates the present invention within the context of forming a bilayer patterned conductor metal stack layer within a microelectronic fabrication, the method of the present invention may also be employed in forming within microelectronic fabrications homogeneous and laminated patterned microelectronic layers including but not limited to patterned microelectronic conductor layers, patterned microelectronic semiconductor layers and patterned microelectronic dielectric layers from corresponding blanket microelectronic conductor layers, blanket microelectronic semiconductor layers and blanket microelectronic dielectric layers.

Figure 1:
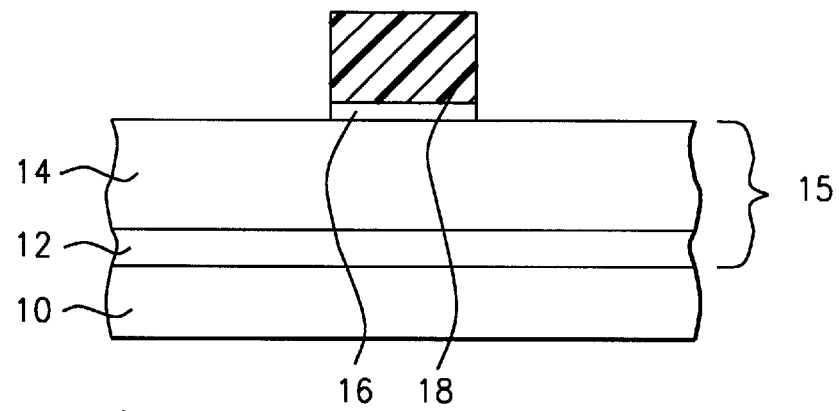
FIG. 1, FIG. 2 and FIG. 3 show a series of schematic cross-sectional diagrams illustrating the results of forming, in accord with a preferred embodiment of the present invention, a patterned conductor stack layer within a microelectronic fabrication.
Figure 2:
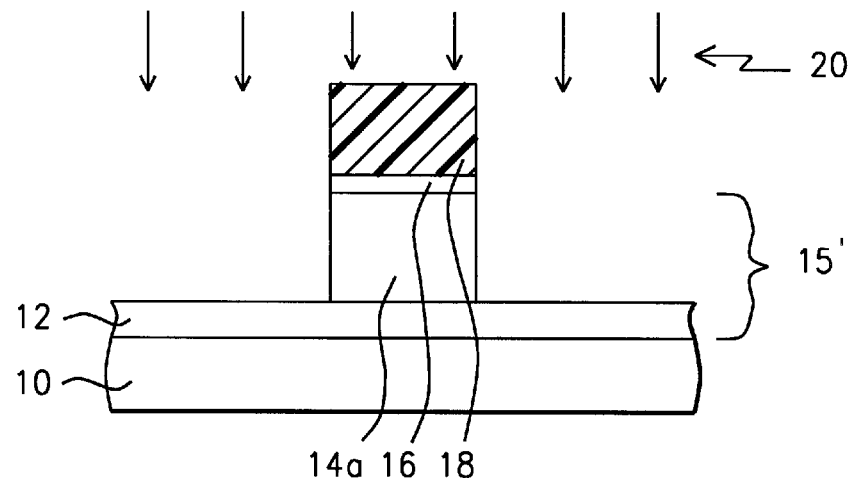
Figure 3:
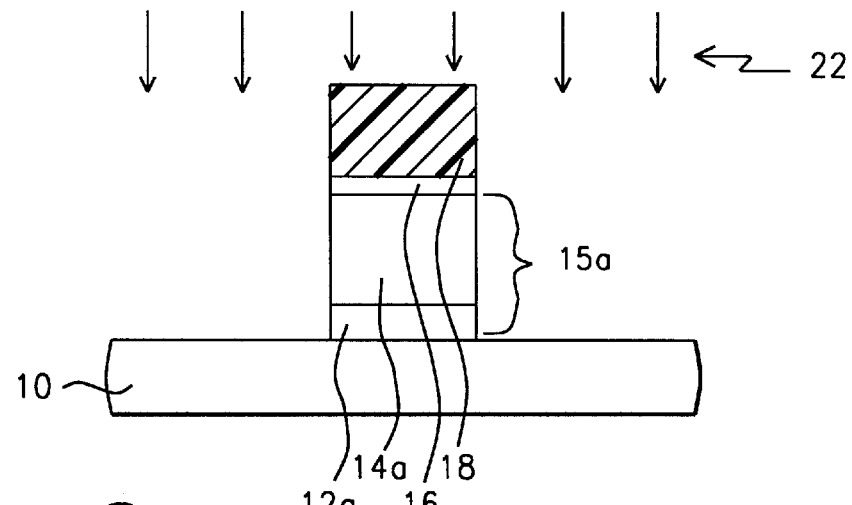

Referring now to FIG. 1 to FIG. 3, there is shown a series of schematic crosssectional diagrams illustrating the results of forming, in accord with a preferred embodiment of the present invention, a patterned conductor stack layer within a microelectronic fabrication. Shown in FIG. 1 is a schematic cross-sectional diagram of the microelectronic fabrication at an early stage in its fabrication in accord with the method of the present invention.

Shown in FIG. 1 is a substrate 10 having formed thereupon a pair of blanket layers. The pair of blanket layers includes a blanket barrier layer 12 and a blanket conductor layer 14. Together, the blanket barrier layer 12 and the blanket conductor layer 14 comprise a blanket conductor stack layer 15. In turn, there is also shown within FIG. 1 formed upon the blanket conductor layer 14 within the blanket conductor stack layer 15 a pair of patterned layers. The pair of patterned layers comprises: (1) a patterned anti-reflective coating (ARC) layer 16 formed upon the blanket conductor layer 14; and (2) a patterned photoresist layer 18 formed and aligned upon the patterned anti-reflective coating (ARC) layer 16. Each of the foregoing substrate 10, the foregoing pair of blanket layers which comprises the blanket conductor stack layer 15 and the pair of patterned layers which are formed upon or over the blanket conductor stack layer 15 may be formed employing methods and materials as are conventional in the art of microelectronic fabrication.

For example, the substrate 10 may be selected from the group of substrates including but not limited to conductor substrates, semiconductor substrates and dielectric substrates employed within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Although not specifically illustrated within the schematic cross-sectional diagram of FIG. 1, the substrate 10 may the substrate alone as employed within the microelectronic fabrication, or in the alternative, the substrate 10 may be the substrate as employed within the microelectronic fabrication, where the substrate has formed thereupon or thereover any of several additional layers as are common within the microelectronic fabrication within which is employed the substrate. Such additional microelectronic layers, similarly with the substrate itself, may be formed of microelectronic materials including but not limited to microelectronic conductor materials, microelectronic semiconductor materials and microelectronic dielectric materials.

Similarly, although also not specifically illustrated within the schematic cross-sectional diagram of FIG. 1, the substrate 10, particularly when the substrate 10 is a semiconductor substrate employed within an integrated circuit microelectronic fabrication as is more preferred within the preferred embodiment of the present invention, will typically and preferably have formed therein and/or thereupon microelectronic devices as are common within the microelectronic fabrication within which is employed the substrate. Such microelectronic devices typically include, but are not limited to resistors, transistors, diodes and capacitors.

Within the preferred embodiment of the present invention with respect to the blanket barrier layer 12, although it is known in the art of microelectronic fabrication that barrier layers may be formed of barrier materials including but not limited to titanium barrier materials, tungsten barrier materials, titanium-tungsten alloy barrier materials, titanium nitride barrier materials and tungsten nitride barrier materials, for the preferred embodiment of the present invention, the blanket barrier layer 12 is preferably formed of a titanium nitride barrier material, although other barrier materials may also be employed when forming the blanket barrier layer 12. Typically and preferably, the blanket barrier layer 12 is formed to a thickness of from about 1000 to about 1500 angstroms upon the substrate 10.

Within the preferred embodiment of the present invention with respect to the blanket conductor layer 14, although it is known in the art of microelectronic fabrication that conductor layers may be formed of conductor materials including but not limited to metal conductor materials, metal alloy conductor materials, highly doped polysilicon conductor materials (having an electrically active dopant concentration of greater than about 1E15 atoms per cubic centimeter) and polycide (highly doped polysilicon/metal silicide stack) conductor materials, for the preferred embodiment of the present invention, the blanket conductor layer 14 is preferably formed of an aluminum-copper alloy conductor material, although other conductor materials may be employed for forming the blanket conductor layer 14. Typically and preferably, the blanket conductor layer 14 is formed to a thickness of from about 8000 to about 9000 angstroms upon the blanket barrier layer 12.

Within the preferred embodiment of the present invention with respect to the patterned anti-reflective coating (ARC) layer 16, although it is known in the art of microelectronic fabrication that anti-reflective coating (ARC) layers may be formed of anti-reflective coating (ARC) materials including but not limited to organic polymer anti-reflective (ARC) coating materials and inorganic thin film anti-reflective coating materials, for the preferred embodiment of the present invention, the patterned anti-reflective coating layer 16 is typically and preferably formed from an organic polymer anti-reflective coating (ARC) material, formed upon the blanket conductor layer 14 to a thickness of from about 250 to about 350 angstroms.

Finally, within the preferred embodiment of the present invention with respect to the patterned photoresist layer 18, although it is known in the art of microelectronic fabrication that photoresist layers may be formed of photoresist materials including but not limited to positive photoresist materials and negative photoresist materials, for the preferred embodiment of the present invention, the patterned photoresist layer 18 is preferably formed of a positive photoresist material, in order to secure optimal linewidth control, preferably formed and aligned upon the patterned anti-reflective coating (ARC) layer 16 to a thickness of from about 18000 to about 22000 angstroms and defining a linewidth of from about 0.3 to about 1.2 microns.

As is understood by a person skilled in the art, the patterned anti-reflective coating (ARC) layer 16 is optional within the context of the preferred embodiment of the present invention, and it is present as an artifact of a blanket anti-reflective coating (ARC) layer employed for purposes of attenuating standing wave reflections when photoexposing a blanket photoresist layer from which is formed the patterned photoresist layer 18. Similarly, as is also understood by a person skilled in the art, although the preferred embodiment of the present invention as shown in FIG. 1 illustrates the patterned photoresist layer 18 which will subsequently be employed as a mask layer within the present invention, there may alternatively be employed a hard mask layer within the method of the present invention.

Referring now to FIG. 2, there is shown a schematic cross-sectional diagram illustrating the results of further processing of the microelectronics fabrication whose schematic cross-sectional diagram is illustrated in FIG. 1.

Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket conductor layer 14 has been patterned to form a patterned conductor layer 14a which in conjunction with the blanket barrier layer 12 comprises a partially etched blanket conductor stack layer 15', while employing the patterned photoresist layer 18 as a mask layer, in conjunction with a first etching plasma 20. Within the preferred embodiment of the present invention, the first etching plasma 20 preferably employs an etchant gas composition appropriate to the aluminum-copper alloy conductor material from which is preferably formed the blanket first conductor layer 14. Such an etchant gas composition typically and preferably employs a chlorine containing etchant gas selected from at least one of the group consisting of chlorine, hydrogen chloride and boron trichloride, along with an optional background sputtering gas, but preferably not an argon sputtering gas. More preferably, as noted below, the etchant gas composition comprises chlorine, boron trichloride and nitrogen. Within the preferred embodiment of the present invention, the first etching plasma 20 also employs a bias voltage which optimizes an etch rate of the blanket conductor layer 14 when forming the patterned conductor layer 14a.

Within the present invention and the preferred embodiment of the present invention it is important to distinguish between various types of bias voltages which may be employed within the present invention, as well as methods through which those bias voltages may be controlled. In a first instance, it is understood by a person skilled in that art that there exists a sheath bias voltage inherent within a plasma employed for processing a substrate, where the sheath bias voltage with respect to the substrate which is plasma processed within the plasma is related to a plasma density within the plasma by the general equation $n_e \; e^{-Vs/constant}$ (where Vs equals sheath bias voltage and $n_e$ equals plasma density). Thus, as a plasma density $n_e$ increases, a sheath bias voltage Vs magnitude (absolute value)

decreases. Similarly, there may also exist within a plasma apparatus an extrinsic bias voltage wherein a substrate within a plasma reactor chamber within a plasma apparatus is extrinsically electrically biased with respect to the plasma reactor chamber. Such an extrinsic electrical bias may be effected employing radio frequency activation or direct current (DC) activation.

More preferably, within the preferred embodiment of the present invention, the first plasma etch method employs an etchant gas composition comprising chlorine, boron trichloride and nitrogen, and the first plasma etch method employs a bias voltage which is effected as a sheath bias voltage and controlled while employing a magnetic confinement of the first etching plasma 20. Preferably, the first plasma etch method also employs, when processing an eight inch diameter substrate: (1) a reactor chamber pressure of from about 0.15 to about 0.20 torr; (2) a source radio frequency power of from about 300 to about 650 watts at a source radio frequency of 13.56 MHZ; (3) a plasma confining magnetic field of up to about 30 gauss; (4) a substrate 10 temperature of from about 85 to about 105 degrees centigrade; (5) a chlorine flow rate of from about 15 to about 30 standard cubic centimeters per minute (sccm); (6) a boron trichloride flow rate of from about 40 to about 50 standard cubic centimeters per minute (sccm); and (8) a nitrogen flow rate of from about 20 to about 30 standard cubic centimeters per minute (sccm).

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the blanket barrier layer 12 has been patterned to form a patterned barrier layer 12a, while also employing the patterned photoresist layer 18 as a mask layer, but now in conjunction with a second etching plasma 22. As is illustrated within the schematic cross-sectional diagram of FIG. 3, the patterned conductor layer 14a and the patterned barrier layer 12a in the aggregate form a patterned conductor stack layer 15a.

Within the preferred embodiment of the present invention, the second etching plasma 22 is preferably formed employing methods and materials analogous or equivalent to the methods and materials employed for forming the first etching plasma 20, but with the exception that a bias voltage employed within the second etching plasma 22 is adjusted such that there is minimized charging of the patterned conductor stack layer 15a within the second etching plasma 22. Although, as noted above, the bias voltage may be controlled within the present invention while employing either or both: (1) a sheath bias voltage within the first etching plasma 20 and the second etching plasma 22 by means of a magnetic confinement of the first etching plasma 20 or the second etching plasma 22; or (2) an extrinsic bias voltage of the substrate 10, for the preferred embodiment of the present invention the bias voltage is adjusted as a sheath bias voltage by magnetic confinement of the first etching plasma 20 and the second etching plasma 22.

Thus, within the preferred embodiment of the present invention, the second etching plasma 22 is employed within a second plasma etch method which employs: (1) a reactor chamber pressure of from about 0.15 to about 0.20 torr; (2) a radio frequency source power of from about 300 to about 650 watts at a source radio frequency of 13.56 MHZ; (3) a plasma confining magnetic field of from about 30 to about 60 gauss; (4) a substrate 10 temperature of from about 85 to about 105 degrees centigrade; (5) a chlorine flow rate of from about 15 to about 30 standard cubic centimeters per minute (sccm); (6) a boron trichloride flow rate of from about 30 to about 50 standard cubic centimeters per minute (sccm); and (8) a nitrogen flow rate of from about 20 to about 30 standard cubic centimeters per minute (sccm).

Upon forming the microelectronics fabrication whose schematic cross-sectional diagram is illustrated in FIG. 3, there is formed a microelectronics fabrication having formed therein a patterned conductor stack layer 15a which is formed with attenuated charging when forming the patterned conductor stack layer 15a while employing a plasma etch method. The method of the present invention realizes the foregoing object by employing within the plasma etch method when forming the patterned conductor stack layer 15a a sequential two step plasma etch method employing a single first plasma etch method followed by a single second plasma etch method, where the second plasma etch method employs a lower bias voltage than the first plasma etch method. Within the present invention, the sequential two step plasma etch method is non-cyclic.

As is understood by a person skilled in the art, and as is noted above, although the preferred embodiment of the present invention illustrates the present invention within the context of forming a patterned conductor stack layer from a corresponding blanket conductor stack layer comprising a blanket barrier layer having formed thereupon a blanket conductor layer, the present invention also provides value when forming a homogeneous patterned conductor layer from a homogeneous blanket conductor layer. Under such circumstances it is required when employing the method of the present invention that a first plasma employed within a first plasma etch method is employed for only partially patterning the blanket conductor layer when forming a partially etched blanket conductor layer, while the second plasma which is employed within a second plasma etch method is employed for completely patterning the partially etched blanket conductor layer when forming the patterned conductor layer, and where the first plasma has a higher bias voltage than the second plasma.

Similarly, and also as noted above, although the preferred embodiment of the present invention illustrates the present invention within the context of forming a patterned conductor stack layer from a blanket conductor stack layer, the present invention may similarly be employed for forming with attenuated plasma induced damage patterned microelectronics layers from corresponding blanket microelectronic layers including but not limited to blanket microelectronic conductor layers, blanket microelectronic semiconductor layers and blanket microelectronic dielectric layers.

EXAMPLES

There was obtained a first series of eight six inch diameter N-(100) silicon semiconductor substrates having formed therein: (1) a first series of electrically isolated ungrounded diode regions; and (2) a second series of electrically isolated grounded diode regions. Similarly, there was also obtained a second series of eight six inch diameter P-(100) silicon semiconductor substrates having formed therein: (1) a first series of electrically isolated ungrounded diode regions; and (2) a second series of electrically isolated grounded diode regions.

Upon each of the sixteen (100) silicon semiconductor substrates was then formed a blanket conductor stack layer comprising: (1) a blanket titanium nitride barrier layer of thickness about 1500 angstroms formed upon the silicon semiconductor substrate and contacting the electrically isolated ungrounded diode regions and the electrically isolated grounded diode regions; and (2) a blanket aluminum-copper alloy conductor layer formed to a thickness of about 8000 angstroms upon the blanket barrier layer. The blanket conductor stack layers were then coated with a series of patterned photoresist layers of thickness about 20000 angstroms having bidirectional linewidth dimensions of about 0.3 by about 1.2 microns which corresponded with the locations of the electrically isolated ungrounded diode regions and the electrically isolated grounded diode regions. The series of blanket conductor stack layers was then etched while employing a plasma etch method employing an etchant gas composition comprising chlorine, boron trichloride and nitrogen to form a series of schottky diode contacts contacting the electrically isolated ungrounded diode regions and the electrically isolated grounded diode regions within the sixteen silicon semiconductor substrates.

The plasma etch method also employed: (1) a reactor chamber pressure of about 0.20 torr; (2) a source radio frequency power of about 600 watts at a source radio frequency of 13.56 MHZ; (3) a semiconductor substrate temperature of about 90 degrees centigrade; (4) a chlorine flow rate of about 25 standard cubic centimeters per minute (sccm); (5) a boron trichloride flow rate of about 40 standard cubic centimeters per minute (sccm); (6) a nitrogen flow rate of about 15 standard cubic centimeters per minute (sccm). Within the plasma etch method, a plasma confining magnetic field was varied from zero to 70 gauss in 10 gauss increments for eight separate pairs of N- and P-silicon semiconductor substrates. The blanket conductor stack layers were etched to an optically detected endpoint while forming the series of schottky diode contacts upon the series of sixteen silicon semiconductor substrates.

There was then measured the threshold voltages for the electrically isolated ungrounded diodes and the electrically isolated grounded diodes. Results of the threshold voltage measurements are shown in FIG. 4 for the series of diodes formed upon the eight P-MOS (100) silicon semiconductor substrates and in FIG. 5 for the series of diodes formed upon the eight N-MOS (100) silicon semiconductor substrates.

Figure 4:
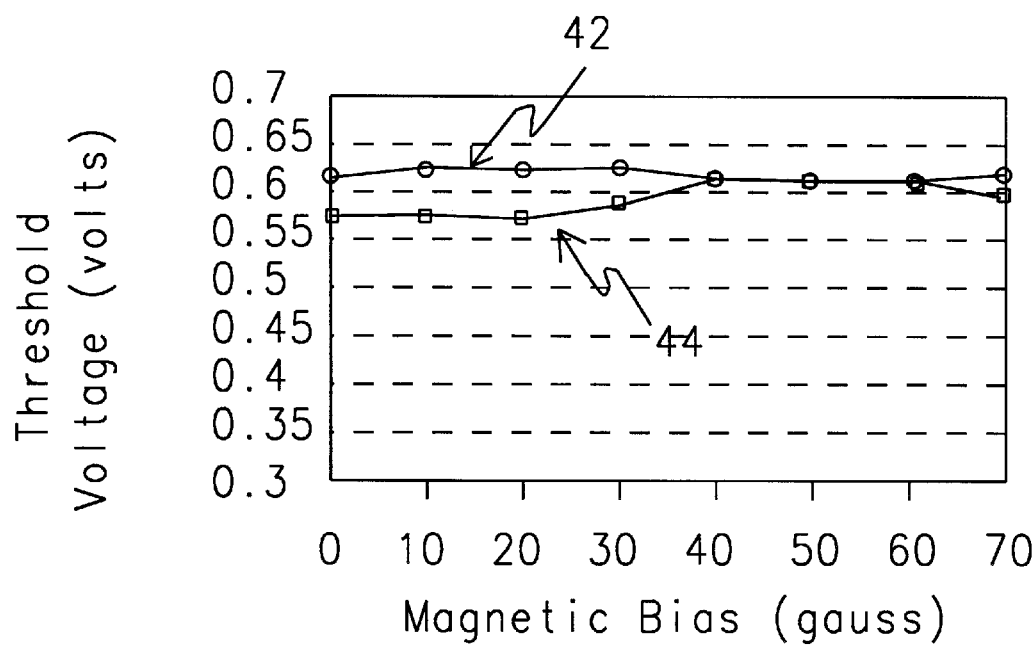
FIG. 4 and FIG. 5 show a pair of graphs of Threshold Voltage versus Magnetic Bias for several series of diodes formed employing a plasma etch method in accord with the examples of the present invention.

Within FIG. 4, line 42 corresponds with measured threshold voltages for electrically isolated grounded diodes as a function of plasma confining magnetic bias field strength within the plasma etch method, while line 44 corresponds with the analogous threshold voltages for the electrically isolated ungrounded diodes.

Figure 5:
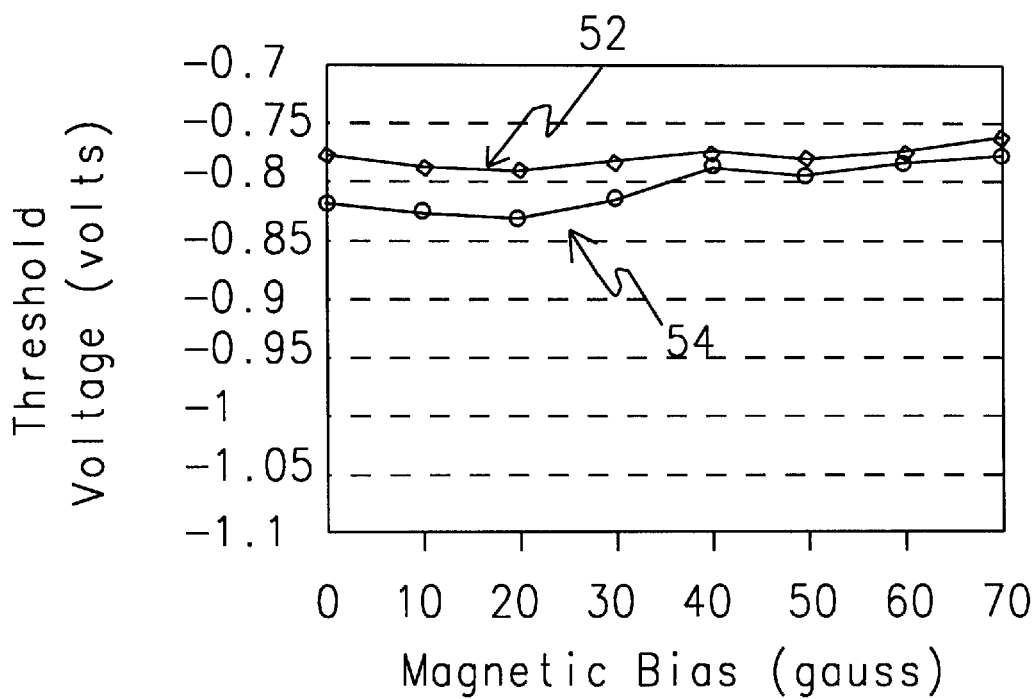

Within FIG. 5, line 52 corresponds with measured threshold voltages for electrically isolated grounded diodes as a function of plasma confining magnetic bias field strength within the plasma etch method, while line 54 corresponds with the analogous threshold voltages for the electrically isolated ungrounded diodes.

As is seen from review of the data within FIG. 4 and FIG. 5, there is a more uniform threshold voltage for: (1) electrically isolated grounded diodes at any extrinsic plasma confining magnetic field strength; and (2) electrically isolated ungrounded diodes at extrinsic plasma confining magnetic bias field strengths of greater than about 40 gauss. It is thus presumed that elevated extrinsic plasma confining magnetic bias field strength facilitates a decreased sheath bias voltage and an attenuated charging when forming the electrically isolated ungrounded diodes, in concert with the present invention.

As is understood by a person skilled in the art, the preferred embodiment and examples of the present invention are illustrative of the present invention rather than limiting of the present invention. Revisions and modifications may be made to methods, materials, structures and dimensions which are employed within the preferred embodiment and examples of the present invention while still providing a method in accord with the present invention, in accord with the appended claims.

What is claimed is:

1. A plasma etch method for forming a patterned layer comprising:

providing a substrate;

forming over the substrate a blanket microelectronic layer;

forming over the blanket microelectronic layer a patterned mask layer;

etching, while employing a single first plasma etch method which employs the patterned mask layer as an etch mask layer, the blanket microelectronic layer to form a partially etched blanket microelectronic layer;

etching, while employing a single second plasma etch method which employs the patterned mask layer as an etch mask layer, the partially etched blanket microelectronic layer to form a patterned microelectronic layer, where the first plasma etch method employs a higher bias voltage than the second plasma etch method.

2. The method of claim 1 wherein by employing the higher bias voltage within the first plasma etch method in comparison with the second plasma etch method the patterned microelectronic layer is formed with attenuated plasma induced damage.

3. The method of claim 1 wherein the blanket microelectronic layer is selected from the group consisting of blanket microelectronic conductor layers, blanket microelectronic semiconductor layers and blanket microelectronic dielectric layers.

4. The method of claim 1 wherein:

the blanket microelectronic layer is a blanket microelectronic conductor bilayer comprising a blanket microelectronic conductor layer formed upon a blanket microelectronic barrier layer;

the blanket microelectronic conductor layer is etched employing the first plasma etch method; and the blanket microelectronic barrier layer is etched employing the second plasma etch method.

5. The method of claim 1 wherein the bias voltage is a sheath bias voltage.

6. The method of claim 5 wherein:

the first plasma etch method is a first magnetically enhanced reactive ion etch (MERIE) method and the second plasma etch method is a second magnetically enhanced reactive ion etch (MERIE) method; and a second sheath bias voltage within the second plasma etch method is adjusted lower than a first sheath bias voltage within the first plasma etch method by employing a higher plasma confining magnetic field within the second plasma etch method in comparison with the first plasma etch method.

7. The method of claim 1 wherein the bias voltage is an extrinsic bias voltage.

8. A plasma etch method for forming a patterned conductor layer comprising:

providing a substrate;

forming over the substrate a blanket microelectronic conductor layer;

forming over the blanket microelectronic conductor layer a patterned mask layer;

etching, while employing a single first plasma etch method which employs the patterned mask layer as an etch mask layer, the blanket microelectronic conductor layer to form a partially etched blanket microelectronic conductor layer;

etching, while employing a single second plasma etch method which employs the patterned mask layer as an etch mask layer, the partially etched blanket microelectronic conductor layer to form a patterned microelectronic conductor layer, where the first plasma etch method employs a higher bias voltage than the second plasma etch method.

9. The method of claim 8 wherein by employing the higher bias voltage within the first plasma etch method in comparison with the second plasma etch method the patterned microelectronic layer is formed with attenuated plasma induced damage.

10. The method of claim 8 wherein:

the blanket microelectronic conductor layer is a blanket microelectronic conductor bilayer comprising a blanket microelectronic bulk conductor layer formed upon a blanket microelectronic barrier layer;

the blanket microelectronic bulk conductor layer is etched employing the first plasma etch method; and the blanket microelectronic barrier layer is etched employing the second plasma etch method.

11. The method of claim 8 wherein the bias voltage is a sheath bias voltage.

12. The method of claim 11 wherein:

the first plasma etch method is a first magnetically enhanced reactive ion etch (MERIE) method and the second plasma etch method is a second magnetically enhanced reactive ion etch (MERIE) method; and a second sheath bias voltage within the second plasma etch method is adjusted lower than a first sheath bias voltage within the first plasma etch method by employing a higher plasma confining magnetic field within the second plasma etch method in comparison with the first plasma etch method.

13. The method of claim 8 wherein the bias voltage is an extrinsic bias voltage.

* * * * *